United States Patent
Xie et al.

(10) Patent No.: US 10,490,475 B2
(45) Date of Patent: Nov. 26, 2019

(54) METHODS FOR SEMICONDUCTOR PASSIVATION BY NITRIDATION AFTER OXIDE REMOVAL

(71) Applicant: ASM IP Holding B.V., Almere (NL)

(72) Inventors: Qi Xie, Leuven (BE); Fu Tang, Gilbert, AZ (US); Michael Givens, Scottsdale, AZ (US); Petri Raisanen, Gilbert, AZ (US); Jan Willem Maes, Wilrijk (BE); Xiaoqiang Jiang, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/169,430

(22) Filed: May 31, 2016

(65) Prior Publication Data

US 2016/0358835 A1 Dec. 8, 2016

Related U.S. Application Data

(63) Continuation-in-part of application No. 14/729,510, filed on Jun. 3, 2015, now Pat. No. 9,711,350.

(51) Int. Cl.
*H01L 23/31* (2006.01)
*H01L 29/161* (2006.01)
(Continued)

(52) U.S. Cl.
CPC ........ *H01L 23/3171* (2013.01); *C23C 16/403* (2013.01); *C23C 16/405* (2013.01);
(Continued)

(58) Field of Classification Search
CPC ............. H01L 23/3171; H01L 29/1054; H01L 29/161; H01L 29/517; H01L 21/28194;
(Continued)

(56) References Cited

U.S. PATENT DOCUMENTS 4,354,198 A 10/1982 Hodgson et al.
4,751,200 A 6/1988 Gmitter et al.
(Continued)

FOREIGN PATENT DOCUMENTS

EP 0 265 314 A1 4/1988
EP 2 068 368 A2 6/2009
(Continued)

OTHER PUBLICATIONS

Bagratishvili, G. D. et al.; "Nonstoichiometric Germanium Nitride, A New Insulating Material for MIS Microelectronics"; 1983; Phys. Stat. Sol. (a) vol. 78; No. 115; pp. 115-123. (Year: 1983).*
(Continued)

*Primary Examiner* — William F Kraig
*Assistant Examiner* — Vicki B. Booker
(74) *Attorney, Agent, or Firm* — Knobbe, Martens, Olson & Bear LLP

(57) ABSTRACT

In some embodiments, a semiconductor surface may be effectively passivated by nitridation, preferably using hydrazine, a hydrazine derivative, or a combination thereof. The surface may be the semiconductor surface of a transistor channel region. In some embodiments, native oxide is removed from the semiconductor surface and the surface is subsequently nitrided. In some other embodiments, a semiconductor surface oxide layer is formed at the semiconductor surface and the passivation is accomplished by forming a semiconductor oxynitride layer at the surface, with the nitridation contributing nitrogen to the surface oxide to form the oxynitride layer. The semiconductor oxide layer may be deposited by atomic layer deposition (ALD) and the nitridation may also be conducted as part of the ALD.

16 Claims, 7 Drawing Sheets

(51) Int. Cl.
*H01L 29/51* (2006.01)
*H01L 21/02* (2006.01)
*C23C 16/40* (2006.01)
*H01L 29/10* (2006.01)

(52) U.S. Cl.
CPC ........ *H01L 21/0228* (2013.01); *H01L 29/161* (2013.01); *H01L 29/517* (2013.01); *H01L 29/1054* (2013.01)

(58) Field of Classification Search
CPC ........... H01L 21/0228; H01L 21/02247; H01L 21/02192; H01L 29/167; H01L 29/513; H01L 21/28255; H01L 21/28247; H01L 21/02112; H01L 21/02299; H01L 21/02304; H01L 21/306; H01L 21/3105; H01L 29/518; H01L 29/16; H01L 21/02172; H01L 21/02181; H01L 21/045; H01L 21/76297; H01L 29/1025; C23C 16/0218; C23C 16/403; C23C 16/405
See application file for complete search history.

(56) References Cited

U.S. PATENT DOCUMENTS

| | | | |
|---|---|---|---|
| 5,124,278 | A | 6/1992 | Bohling et al. |
| 5,168,077 | A | 12/1992 | Ashizawa et al. |
| 5,393,680 | A | 2/1995 | Shikata |
| 5,451,542 | A | 9/1995 | Ashby |
| 5,470,799 | A * | 11/1995 | Itoh .................. H01L 21/02046 257/E21.226 |
| 5,646,419 | A | 7/1997 | McCaldin et al. |
| 5,760,462 | A | 6/1998 | Barron et al. |
| 6,071,780 | A | 6/2000 | Okamoto et al. |
| 6,112,013 | A | 8/2000 | Hsiao et al. |
| 6,117,720 | A | 9/2000 | Harshfield |
| 6,150,253 | A | 11/2000 | Doan et al. |
| 6,207,976 | B1 | 3/2001 | Takahashi et al. |
| 6,248,605 | B1 | 6/2001 | Harkonen et al. |
| 6,380,097 | B1 | 4/2002 | Dauplaise et al. |
| 6,445,015 | B1 | 9/2002 | Braddock |
| 6,534,368 | B2 | 3/2003 | Zahorik |
| 6,635,951 | B1 | 10/2003 | Zahorik |
| 6,670,651 | B1 | 12/2003 | Braddock |
| 6,709,958 | B2 | 3/2004 | Li et al. |
| 6,710,423 | B2 | 3/2004 | Moore et al. |
| 6,727,142 | B1 * | 4/2004 | Gluschenkov ...... H01L 21/3141 438/246 |
| 6,727,192 | B2 | 4/2004 | Moore et al. |
| 6,730,547 | B2 | 5/2004 | Li et al. |
| 6,734,455 | B2 | 5/2004 | Li |
| 6,791,125 | B2 | 9/2004 | Demkov et al. |
| 6,809,370 | B1 * | 10/2004 | Colombo .......... H01L 21/28185 257/310 |
| 6,812,087 | B2 | 11/2004 | Giltom et al. |
| 7,094,651 | B2 | 8/2006 | Mitzi et al. |
| 7,094,700 | B2 | 8/2006 | Li et al. |
| 7,238,291 | B2 * | 7/2007 | Onsia ................ H01L 21/31111 216/100 |
| 7,242,041 | B2 | 7/2007 | Bucher et al. |
| 7,307,277 | B2 | 12/2007 | Frey et al. |
| 7,341,960 | B2 | 3/2008 | Lee et al. |
| 7,394,088 | B2 | 7/2008 | Lung |
| 7,619,248 | B1 | 11/2009 | Cleeves |
| 7,678,708 | B2 | 3/2010 | Vaartstra et al. |
| 7,964,490 | B2 | 6/2011 | Clendenning et al. |
| 7,972,898 | B2 | 7/2011 | Cowdery-Corvan et al. |
| 8,017,484 | B2 * | 9/2011 | Luan ................ H01L 21/28185 257/411 |
| 8,766,330 | B2 | 7/2014 | Paranjape et al. |
| 8,796,125 | B2 | 8/2014 | Rockenberger et al. |
| 9,245,742 | B2 | 1/2016 | Haukka et al. |
| 9,478,419 | B2 | 10/2016 | Haukka et al. |
| 9,711,396 | B2 | 7/2017 | Tang et al. |
| 9,741,815 | B2 | 8/2017 | Xie et al. |
| 2002/0041931 | A1 | 4/2002 | Suntola et al. |
| 2002/0081826 | A1 * | 6/2002 | Rotondaro ........ H01L 21/28185 438/585 |
| 2002/0106849 | A1 | 8/2002 | Moore |
| 2002/0142624 | A1 * | 10/2002 | Levy .................. C23C 16/0218 438/786 |
| 2005/0257824 | A1 | 11/2005 | Maltby et al. |
| 2006/0292872 | A1 * | 12/2006 | Haukka ............... C23C 16/0272 438/680 |
| 2007/0111429 | A1 | 5/2007 | Lung |
| 2008/0006930 | A1 | 1/2008 | Ichida |
| 2008/0083924 | A1 | 4/2008 | Song et al. |
| 2008/0153039 | A1 | 6/2008 | Akimoto |
| 2008/0272355 | A1 | 11/2008 | Cho et al. |
| 2008/0289650 | A1 * | 11/2008 | Arena .................. B08B 7/0057 134/1.2 |
| 2010/0059820 | A1 | 3/2010 | Ohmi et al. |
| 2010/0072451 | A1 | 3/2010 | Terao et al. |
| 2010/0159135 | A1 | 6/2010 | Bent et al. |
| 2010/0203672 | A1 | 8/2010 | Eun et al. |
| 2010/0300524 | A1 | 12/2010 | Martinson et al. |
| 2011/0006354 | A1 | 1/2011 | Jangjian et al. |
| 2011/0124141 | A1 | 5/2011 | Goeoetz et al. |
| 2011/0147795 | A1 | 6/2011 | Rachmady et al. |
| 2011/0156174 | A1 | 6/2011 | Dewey et al. |
| 2013/0157405 | A1 | 6/2013 | Cao et al. |
| 2013/0270505 | A1 | 10/2013 | Dahmani |
| 2014/0004674 | A1 * | 1/2014 | Ando ................ H01L 21/28255 438/287 |
| 2014/0011339 | A1 * | 1/2014 | Zheng ................ H01L 21/3065 438/466 |
| 2014/0027884 | A1 | 1/2014 | Tang et al. |
| 2015/0340228 | A1 * | 11/2015 | Tapily .................. H01L 29/167 257/618 |

FOREIGN PATENT DOCUMENTS

| | | |
|---|---|---|
| JP | H03-278584 | 12/1991 |
| KR | 10-2004-0038514 | 5/2004 |
| WO | WO 97/48499 | 12/1997 |
| WO | WO 02/15285 A1 | 2/2002 |
| WO | WO 03/019691 A2 | 3/2003 |
| WO | WO 2004/032242 A1 | 4/2004 |

OTHER PUBLICATIONS

Alian, et al., "Ammonium sulfide vapor passivation of/$In_{0.53}Ga_{0.47}As$ and InP surfaces," Applied Physics Letters, vol. 99, Issue 11, pp. 112114-112114-3, Sep. 2011.

Alian, et al., "Oxide trapping in InGaAs—$Al_2O_3$ system and the role of sulfur in reducing the $Al_2O_3$ trap density," Electron Device Letters, vol. 33, Issue 11, pp. 1544-1546, Sep. 21, 2012.

Brennan, B.Sc., "Surface and interface characterization of high-k dielectric materials on silicon and III-V semiconductor substrates," Dublin City University, School of Physical Sciences, Dec. 2009.

Genevee, et al. "Atomic layer deposition of zinc indium sulfide films: Mechanistic studies and evidence of surface exchange reactions and diffusion processes," Journal of Vacuum Science & Technology A., vol. 31, Issue 1, Jan./Feb. 2013.

Hsueh, C., "Alternative Materials for Next-Generation Transistors: High-k/Ge based MOSFET", A dissertation submitted to the Graduate School—New Brunswick Rutgers, 2008, 139 pages.

Ihanus, et al., "Atomic Layer Deposition of SrS and BaS Thin Films Using Cyclopentadienyl Precursors," Chemistry of Materials, vol. 14, Issue 5, pp. 1937-1944, May 2002.

Kukli, et al., "Controlled Growth of Yttrium Oxysulphide Thin Films by Atomic Layer Deposition," Materials Science Forum, vols. 315-317, pp. 216-221, dated 1999.

Leskela et al., "Atomic layer deposition (ALD): from precursors to thin film structures", Thin Solid Firms, vol. 409, (2002), pp. 138-146.

Lin, J., "Low Resistance Contacts to N-Type Germanium", A dissertation submitted to the Department of Electrical Engineering, Jun. 2013, 136 pages.

(56) References Cited

OTHER PUBLICATIONS

Misra, "High k dielectrics on High-Mobility Substrates: The Interface!" The Electrochemical Society, pp. 47-51, Winter 2011.
O'Connor, et al., "A systematic study of $(NH_4)_2S$ passivation (22%, 10%, 5%, or 1%) on the interface properties of $Al_2O_3$/ $In_{0.53}Ga_{0.47}As$/ InP system for n-type and p-type $In_{0.53}Ga_{0.47}As$ epitaxial layers," Journal of Applied Physics, vol. 109, Issue 2, pp. 024101-024101-10, dated 2011.
O'Connor, et. al., "Analysis of the minority carrier response of n-type and p-type Au/ Ni/ Al2O3/In0.53Ga0.47/InP capacitors following an optimized (NH4)2S treatment," Applied Physicas Letters, vol. 99, Issue 21, pp. 212901-212901-3, dated 2011.
International Search Reporting for International Application No. PCT/US2014/066316, Notification dated Mar. 3, 2015.
International Search Report and Written Opinion for International Application No. PCT/US2014/066310, Notification dated Sep. 2, 2015.

\* cited by examiner

US 10,490,475 B2

METHODS FOR SEMICONDUCTOR PASSIVATION BY NITRIDATION AFTER OXIDE REMOVAL

CROSS REFERENCE TO RELATED APPLICATIONS

This Application is a continuation-in-part of U.S. patent application Ser. No. 14/729,510, filed Jun. 3, 2015, which is hereby incorporated by reference in its entirety.

BACKGROUND

Field

This disclosure relates generally to semiconductor processing and, more particularly, to passivation of semiconductor substrates, including passivation of channel regions of transistors.

Description of the Related Art

Semiconductor materials that exhibit high charge-carrier mobility have gained interest as possible materials for use in various electronic devices, such as transistors in integrated circuits. High charge-carrier mobility materials have a higher charge-carrier mobility than silicon, and may improve the performance of these electronic devices, relative to forming the devices using silicon as the only semiconductor. Examples of high charge-carrier mobility semiconductor materials include silicon germanium, germanium and group III-V semiconductor materials, such as GaAs, InP, InGaAs, InAs, and GaSb.

The passivation of semiconductor materials can improve the electrical properties of devices formed with these materials, and may also improve the physical properties and physical stability of those materials, which can provide benefits for device reliability. For example, passivating the surface of a transistor channel region before forming a gate dielectric can improve the performance of the resulting transistor. However, the passivation of high mobility semiconductors faces various challenges and work continues on developing suitable passivation techniques for these materials.

SUMMARY

In some embodiments, a method for integrated circuit fabrication is provided. The method comprises removing native oxide from a surface of a semiconductor substrate; and subsequently passivating the surface by exposing the substrate to at least one of hydrazine and a hydrazine derivative.

In some other embodiments, a method for integrated circuit fabrication is provided. The method comprises removing native oxide from a surface of a transistor channel region of a semiconductor substrate; and nitriding the surface by exposing the surface to a nitrogen precursor.

In yet other embodiments, a semiconductor processing reactor system is provided. The reactor system comprises a pre-treatment chamber and a nitridation chamber for accommodating a substrate. A source of pre-treatment reactant is in gas communication with the pre-treatment chamber, and a source of nitrogen precursor is in gas communication with the nitridation chamber. The reactor system also comprises a controller configured to control: the timing and flow of the pre-treatment reactant into the pre-treatment chamber; and the timing and flow of the nitrogen precursor into the nitridation chamber. In addition, the controller is programmed to implement: exposure of the substrate to the pre-treatment reactant in the pre-treatment chamber; and exposure of the substrate to the nitrogen precursor in the nitridation chamber.

DETAILED DESCRIPTION

Figure 1:
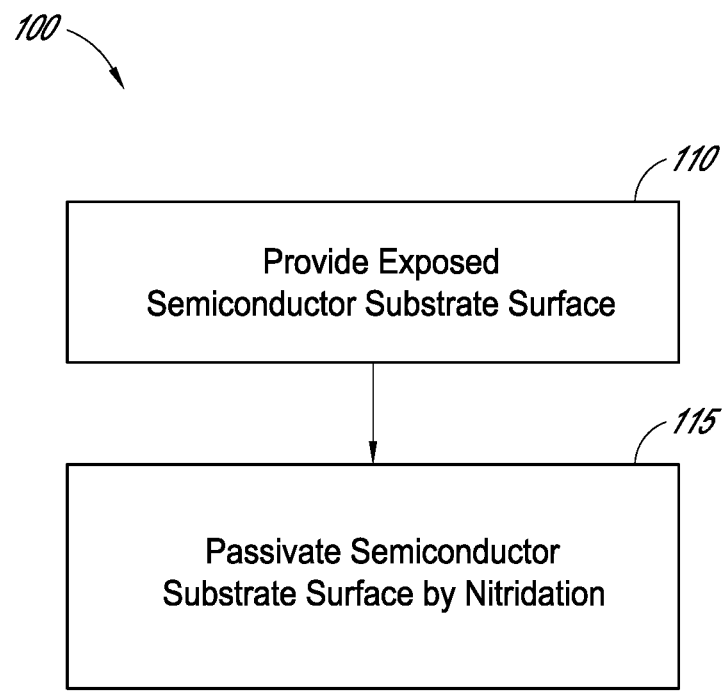
FIG. 1 is a flow chart generally illustrating a process for semiconductor passivation, according to some embodiments.

Various approaches have been proposed for passivating semiconductors, including semiconductors having high charge-carrier mobility (also referred to as high mobility semiconductors), but these approaches have been found to have significant drawbacks. Passivation of a channel region surface using deposited silicon is one approach that has been developed for p-doped germanium-based MOSFETs. However, this approach may have a high cost and low throughput since it relies on a low temperature epitaxial deposition process, and may also have an undesirable inversion thickness and conformality issues, particularly in FinFET/vertical nanowire devices. In addition, without being limited by theory, passivation using silicon is not believed to be suitable for n-doped germanium transistor devices due to a high interface state density (Dit) at the germanium conduction band edge, as well as having no electron confinement for silicon with respect to germanium.

The atomic layer deposition (ALD) of $GeO_2$ has been proposed as another approach for forming a passivation layer for germanium transistor devices, and may also be suitable for CMOS devices by providing low Dit for both p-doped and n-doped germanium devices. However, the physical instability of $GeO_2$ may not be compatible with process flows for fabricating transistors. In addition, $GeO_2$ exhibits undesirably high oxide trap density and may cause device reliability issues.

In accordance with some embodiments, a semiconductor surface may be effectively passivated by nitridation, preferably using hydrazine, a hydrazine derivative, or a combination thereof. The surface that is passivated may be the surface of a transistor channel region. Preferably, the surface is subjected to an oxide removal (e.g., to remove native oxide) before the nitridation. In addition, preferably, the nitridation occurs before subjecting the substrate to any other treatment or deposition processes.

In some embodiments, a dielectric gate stack may be formed over, and preferably in contact with, the passivated semiconductor surface. The gate stack may include an interface layer, or interlayer, between the passivated surface and a thicker dielectric layer. As examples, the interface layer may be formed of a metal oxide, such as lanthanum silicon oxide, and the dielectric layer may be formed of a high-k dielectric material, such as hafnium oxide.

In some other embodiments, the passivation is accomplished by forming a semiconductor oxynitride layer on the surface, with the oxynitride layer formed by nitridation using hydrazine, a hydrazine derivative, or a combination thereof. Passivation using such an oxynitride layer may advantageously be applied to, e.g., surfaces comprising germanium, or silicon germanium with high levels of germanium (e.g., greater than 50%, or greater than 75%, germanium).

In some embodiments, the surface of the semiconductor has a semiconductor oxide-containing film or layer (e.g., a surface oxide), which may be nitrided to form an oxynitride compound. For example, a semiconductor oxide-containing film may be formed by oxidizing the semiconductor surface, by deposition of a semiconductor oxide-containing film on and in contact with the semiconductor surface, or a combination thereof. Preferably, the semiconductor oxide-containing film is deposited by atomic layer deposition (ALD). As used herein, a semiconductor oxide-containing film is a film or layer that comprises the oxide of a semiconductor.

In some other embodiments, a semiconductor oxynitride compound is deposited on the high mobility semiconductor. For example, the semiconductor oxynitride may be deposited by ALD, using temporally-separated pulses of a semiconductor precursor, an oxygen precursor, and a nitrogen precursor.

In some embodiments, as noted above, a gate stack may be formed over the passivated semiconductor surface. In embodiments where a semiconductor oxynitride is formed over the surface, the semiconductor oxynitride layer may be an interlayer disposed, for example, between the semiconductor substrate and a dielectric layer, e.g., a gate dielectric layer. In some embodiments, the semiconductor oxynitride layer forms a part of the gate stack.

Advantageously, passivation by nitridation using hydrazine or its derivatives can provide various benefits. In some embodiments, such nitridation can provide exceptionally low oxide trap density levels. In some embodiments, using such nitridation (e.g., nitridation of germanium substrates) to form a nitrogen-containing layer can provide both low oxide trap densities and low Dit. The nitrogen containing layer is highly stable, which advantageously can provide good device reliability.

Reference will now be made to the Figures Like numerals refer to like features throughout.

FIG. 1 is a flow chart generally illustrating a process 100 for semiconductor passivation, according to some embodiments. At block 110, an exposed semiconductor substrate surface is provided. The exposed semiconductor surface may be part of a semiconductor substrate. As used herein, it will be appreciated that a semiconductor substrate is a substrate that is at least partially formed of semiconductor material. For example, in some embodiments, the semiconductor substrate may be a semiconductor wafer, or may be a semiconductor wafer having overlying conductive (e.g., semiconductor) and/or dielectric materials.

Preferably, the exposed semiconductor substrate surface comprises a high mobility semiconductor. In some embodiments, the high mobility semiconductor at the exposed surface comprises germanium, silicon germanium (e.g., having a germanium content of 95% or less or, more preferably, 75% or less), a group III-V semiconductor, a group II-VI semiconductor, or a 2D material such as MoS and graphene. In some embodiments, the semiconductor comprises InGaAs. Other suitable substrate surfaces include, GaAs, InP, InAs, and GaSb. In some embodiments the substrate may be a 300 mm or a 450 mm wafer. In some embodiments, the substrate surface comprises multiple materials, including multiple semiconductor materials. In some other embodiments, the semiconductor substrate surface to be passivated may be a silicon surface, without other semiconductors.

The exposed surface may include the surface of a channel region of a transistor. The transistor may be, for example, a planar transistor, or may be a non-planar transistor, including a FinFET device or a vertical nanowire/gate-all-around (GAA) device. In some embodiments, the transistors may be implemented as part of a complementary metal oxide semiconductor (CMOS) type integrated circuit. These CMOS integrated circuits utilize transistors having different doping types. For example, the transistors may be formed in pairs, with one member of each pair having a channel region that is N-doped, and another member of the pair having a channel region that is P-doped. It will be appreciated that the exposed surface may extend horizontally, vertically, or at an angle.

With continued reference to FIG. 1, the exposed semiconductor substrate surface provided at block 110 is preferably substantially oxygen free. In some embodiments, at block 110, the substantially oxygen-free substrate surface is formed by subjecting the substrate to a native oxide removal process, to remove native oxide of the substrate surface. The native oxide removal may be accomplished by, e.g., exposing the substrate surface to a pre-treatment reactant such as $(NH_4)_2S$, $H_2S$, HCl, HBr, $Cl_2$, HF, or combinations thereof. Such a native oxide removal process may also be referred to as a pre-clean process.

In some embodiments, the pre-treatment may include exposing the substrate to a liquid phase etchant followed by exposing the substrate to a gas phase etchant. For example, the pre-treatment may include a wet etching step (e.g., using an acid such as HCl or HF) to remove native oxide; subsequently, a gas phase etchant (e.g., HF, HCl, or cyclic HCl/H2O) may be employed to remove residue/oxide regrowth caused by exposure of the substrate to air after the wet etching. In some embodiments, the wet etch may be conducted in a separate chamber from the gas phase etch, and the gas phase etch may be conducted in the same reaction chamber as the nitridation, which may advantageously reduce the impact of any oxide regrowth before the nitridation. In some other embodiments, the gas phase etch is performed in a separate preclean chamber from the nitridation chamber in which the substrate is nitrided.

With continued reference to FIG. 1, at block 115, the exposed semiconductor substrate surface is passivated by nitridation. In some embodiments, the semiconductor surface is exposed to a nitrogen precursor, which reacts with the surface to form a nitrogen-containing film at the surface. Preferably, the nitrogen precursor is hydrazine ($N_2H_4$), a hydrazine derivative or variant, or a combination thereof. Examples of hydrazine variants or derivatives include dimethylhydrazine ($Me_2NNH_2$), tert-butylhydrazine (t-BuNHNH$_2$), bis(tertbutylhydrazido)diethylsilane, and bis(N,N-dimethylhydrazido)diethylsilane. The nitrogen precursor exposure is preferably performed for a duration ranging from about 10 seconds to about 5 minutes, more preferably from about 20 seconds to about 2 minutes. The process temperature during the nitrogen precursor exposure, e.g., the temperature of the substrate, is preferably in the range from about 50° C. to about 500° C., more preferably about 100° C. to about 400° C., including about 150° C. to about 400° C., and about 200° C. to about 300° C. The nitrogen precursor exposure may be accomplished by flowing nitrogen precursor into a process or reaction chamber into which the substrate is loaded.

After passivating the semiconductor surface by nitridation, one or more dielectric layers may be deposited over and in contact with the passivated surface in some embodiments. For example, a dielectric gate stack may be formed directly on the passivated surface. In some embodiments, the dielectric gate stack may include an interface layer formed on and in contact with the passivated surface, and a dielectric layer may subsequently be formed on the interface layer. As disclosed herein, the interface layer may be formed by an oxide, including a metal oxide. Examples of suitable metal oxides include transition metal silicon oxides (transition metal silicates), including rare earth metal oxides, such as lanthanum silicon oxide or lanthanum silicate (LaSiO) and yttrium silicon oxide or yttrium silicate (YSiO). Advantageously, the incorporation of silicon in the metal oxides is believed to increase the stability and reliability of the metal oxide film. Without being limited by theory, it is believed that the incorporation of silicon into the film beneficially reduces the hydroscopic properties of the metal oxide. A dielectric layer, such as a high-K dielectric layer, may subsequently be formed over the interface layer. Examples of suitable high-K dielectric layers include hafnium oxide layers.

In some embodiments, the metal silicon oxide is formed using a cyclic deposition (e.g., an atomic layer deposition) comprising a "master" cycle comprising two subcycles. One subcycle may be a silicon oxide subcycle, and the other subcycle may be a rare earth metal oxide subcycle. The silicon oxide subcycle may be performed X times and the rare earth metal oxide subcycle may be performed Y times to complete one master cycle. It will be appreciated that the relative order of the silicon oxide and rare earth metal oxide subcycles may be varied, and the values of X and Y may be different and may vary over the course of the deposition to form, e.g., an interface layer with a graded composition that varies with height.

The silicon oxide subcycle may comprise temporally-separated exposures of the substrate to each of a silicon (Si) precursor and an oxygen precursor, with removal of the respective precursors away form the substrate (e.g., by purging and/or evacuation) after exposure to each precursor and before exposure to another precursor. The Si precursor may include, with limitation, one or more of: a silicon halide based precursor such as silicon tetrachloride ($SiCl_4$), tricolored-silane ($SiCl_3H$), dichloro-silane ($SiCl_2H_2$), or monochloro-silane ($SiClH_3$); an oxysilane based precursor, such as tetraethoxysilane $Si(OC_2H_5)_4$; or an amino-based precursor. Examples of amino-based precursors include: hexakis (ethylamino)disilane (AHEAD) and $SiH[N(CH_3)_2]_3$ (3DMASi); bis(dialkylamino)silanes, such as BDEAS (bis (diethylamino)silane); and mono(alkylamino)silanes, such as di-isopropylaminosilane. The oxygen precursor may include, without limitation, one or more of: $H_2O$, diatomic oxygen ($O_2$), hydrogen peroxide ($H_2O_2$), ozone ($O_3$), and methyl alcohol ($CH_3OH$). Examples of process parameters for the deposition include deposition temperatures in the range from 150-350° C. (including 200-350° C.), and deposition pressures ranging from 1 to 10 Torr. In some embodiments, different oxidizing precursors may be used for different subcycles; for example, $O_3$ may be used for the silicon oxide subcycle, while water can be used for the rare earth metal oxide subcycle.

The rare earth metal oxide subcycle may comprise temporally-separated exposures of the substrate to a rare earth metal precursor and an oxygen precursor. After exposure to one of these precursors, the respective precursor may be removed away form the substrate (e.g., by purging and/or evacuation) before exposure to another precursor.

In some embodiments, the rare earth metal precursor, such as a lanthanum precursor, comprises a bond between lanthanum and nitrogen. In some embodiments, the rare earth metal precursor may comprise a bidentate ligand bonded to lanthanum through two nitrogen atoms. In some embodiments, the rare earth metal in the rare earth metal precursor (e.g., lanthanum) has an oxidation state of +III. In some embodiments, the rare earth metal precursor has three organic ligands, such as ligands containing nitrogen. In some embodiments, the rare earth metal precursor (e.g., lanthanum) does not comprise silicon.

Examples of lanthanum precursors for the rare earth metal oxide subcycle include, without limitation, one or more of: an amidinate based precursor, such as lanthanum formamidinate (La(FAMD)$_3$) or tris(N,N'-diisopropylacetamidinato)lanthanum (La(iPrAMD)$_3$); a diketonate precursor, such as (La(THD)$_3$); a Cp(cyclopentadienyl)-based precursor such as tris(isopropylcyclopentadienyl) lanthanum (La(iPrCp)$_3$); or an amido-based chemistry such as tris(bistrimethylsilylamido)-lanthanum (La[N(SiMe$_3$)$_2$]$_3$). In some embodiments, the oxygen precursor may include, without limitation, one or more of: $H_2O$, diatomic oxygen ($O_2$), hydrogen peroxide ($H_2O_2$), ozone ($O_3$), or methyl alcohol ($CH_3OH$).

It will be appreciated that the lanthanum oxide subcycle may be substituted with an yttrium oxide subcycle or a subcycle using another elements or compounds, depending on the desired final product. Examples of other elements include lanthanides, erbium, erbium oxide, magnesium, magnesium oxide, scandium, and scandium oxide. These other elements or compounds may be desirable as they demonstrate an ability to cause $V_t$ shift.

Where yttrium is used as the rare earth metal, examples of yttrium precursors include, without limitation, one or more of the following: a Cp(cyclopentadienyl)-based chemistry, such as Y(EtCp)$_3$ and tris(methylcyclopentadienyl)yttrium (Y(MeCp)$_3$); an amidinate-based precursor, such as Tris(N, N'-diisopropylacetamidinato) Yttrium (TDIPAY); a diketonate precursor, such as (Y(THD)$_3$) and tris(2,2,6,6-tetramethyl-3,5-octanedionato)Yttrium (Y(tmod)$_3$); or an amide based precursor, such as Tris[N,N-bis(trimethylsilyl)amide] yttrium. Examples of deposition temperatures range from 150-350° C. (or alternatively 200-350° C.), and examples of deposition pressures range from 1 to 10 Torr.

Advantageously, to ability to vary the pulse ratio (X:Y) of the silicon and lanthanum oxide subcycles allows for incorporation of desired amounts of silicon (Si) into the metal silicate film. Control of the pulse ratio can enable Si incorporation to exceed 65% in some embodiments. With being limited by theory, it is believed that a higher Si content may reduce the hygroscopic property of LaO and also improve compatibility with the growth of a subsequently deposited high-k dielectric layer. An additional benefit attained with the above-noted deposition includes low carbon impurity level. It will be appreciated that carbon is considered a trap center and may degrade the performance of the deposited device. As a result, a lower carbon level may be preferable. In some embodiments, the carbon impurity level may be less than 5%.

Figure 2:
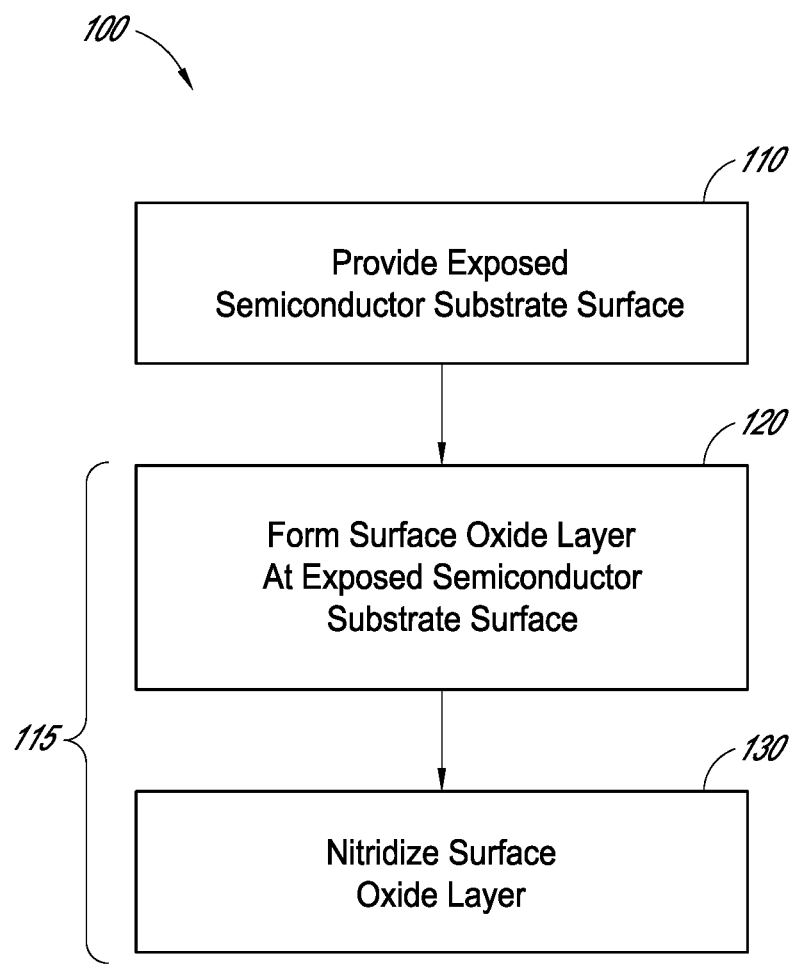
FIG. 2 is a flow chart illustrating further details of some embodiments of the process of FIG. 1, in which an oxide layer is formed before nitridizing the substrate.

With reference now to FIG. 2, in some embodiments, exposing the semiconductor surface (e.g., a high mobility semiconductor) to the nitrogen precursor forms a semiconductor oxynitride compound. For example, surface oxide may be formed at the semiconductor surface, e.g., by oxidizing the surface and/or by depositing a semiconductor oxide on and in contact with the surface, and the surface oxide may be nitrided by exposure to the nitrogen precursor, thereby forming the semiconductor oxynitride compound. In some embodiments, as discussed herein, the exposures to a semiconductor precursor, an oxygen precursor, and a nitrogen precursor may be cycled to form a semiconductor oxynitride layer.

FIG. 2 illustrates a flow chart illustrating further details of some embodiments of the process 100 of FIG. 1, in which an oxide layer is formed before nitriding the substrate. At block 110, an exposed semiconductor surface is provided. The details of block 110 are identical to that for block 110 of FIG. 1, discussed above. For example, in some embodiments the substrate surface may be subjected to a pre-treatment process at block 110, which may comprise one or more steps. In the pre-treatment, the substrate surface may be exposed to one or more pre-treatment reactants and/or to specific conditions, such as temperature or pressure. A pre-treatment may be used for any number of reasons including to clean the substrate surface, remove impurities, remove native oxide, and provide desirable surface terminations. Preferably, the pre-treatment removes native oxide, to leave a substantially oxygen-free semiconductor surface. In some embodiments, a pre-treatment comprises exposing the substrate surface to one or more pre-treatment (or "pre-clean") reactants, such as $(NH_4)_2S$, $H_2S$, HCl, HBr, $Cl_2$, HF, or combinations thereof. In some embodiments, such as where a III-V material is used, HCl may be used as the pre-treatment reactant. In some embodiments, such as where a germanium substrate is used, HF may be used as the pre-treatment reactant. In some embodiments, multiple pre-treatment reactants are used sequentially or simultaneously. For example, as discussed herein, the pre-treatment may include exposing the substrate to a liquid phase etchant followed by exposing the substrate to a gas phase etchant.

With continued reference to FIG. 2, block 115 corresponds to the nitridation block 115 of FIG. 1. However, rather than nitriding the exposed high mobility semiconductor itself, a surface oxide layer is formed and nitrided in the embodiments of FIG. 2. At block 120, an oxide layer is formed on and in contact with the exposed high mobility semiconductor.

In some embodiments, the oxide is preferably a semiconductor oxide, which forms a semiconductor oxide-containing film (which may also be referred to as a semiconductor oxide layer). The semiconductor oxide may be formed by oxidizing the exposed high mobility semiconductor. For example, the substrate may be thermally oxidized by contacting the substrate with oxidant, such as $O_2$, $O_3$, $H_2O$, $H_2O_2$, $N_2O$, NO, $NO_2$, or combinations thereof. It will be appreciated that the thermal oxidation is performed without plasma-activating the oxidant. In some other embodiments, the oxidant may be plasma-activated. Among other things, the duration and temperature of the oxidation may be selected to form an oxide layer of a desired thickness. For example, the thickness of the oxide layer may be about 0.1 nm to about 1.5 nm, preferably about 0.1 nm to about 1.0 nm.

In some other embodiments, the semiconductor oxide layer is formed by a deposition process, including vapor deposition processes such as chemical vapor deposition (CVD). It will be appreciated that, for CVD, the substrate is exposed to mutually reactive precursors that react, e.g. in the gas phase, to deposit a compound comprising elements of those precursors on the substrate. Reaction conditions may be established to decompose the precursors before and/or upon contact with the substrate.

More preferably, the semiconductor oxide layer is deposited by atomic layer deposition (ALD). It will be appreciated that the ALD-type processes for forming the various layers described herein are based on controlled, self-limiting surface reactions and can provide precise control of the film composition and layer thickness, and high conformality. Gas phase reactions are avoided by contacting, or exposing, the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants. In some other embodiments, the alternating reactant exposures may be accomplished by movement of the substrate and/or reactor parts, without stopping and starting the flow of precursors into the deposition chamber to accomplish the alternating exposures. It will be appreciated that, as used herein, an exposure to a particular reactant may also be referred to as a "pulse," and "reactants" may also be referred to as "precursors." Exposure of the substrate to a sequence including each reactant for the deposition constitutes a deposition cycle; for example, where two reactants are utilized, exposing the substrate to a first and then a second reactant can constitute one deposition cycle.

Each reactant pulse is preferably self-limiting. An excess of reactant is supplied during the pulse to saturate the susceptible structure surfaces. In theory, surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the deposition conditions to achieve some decomposition reaction, such as would occur in CVD or CVD-like processes. Limited CVD reactions mixed with the self-limiting ALD reactions can raise the deposition rate. The deposition cycles are repeated a desired number of times to form a layer of a desired thickness.

Deposition temperatures are preferably maintained below the precursor thermal decomposition temperature but at a high enough level to avoid condensation of reactants and to provide the activation energy for the desired surface reactions. The appropriate temperature window for any given ALD reaction will depend upon the surface termination and reactant species involved. The reaction temperature for the various atomic layer depositions herein may be in a range from about room temperature to about 500° C., including from about 20° C. to about 500° C., from about 150° C. to about 400° C., from about 200° C. to about 350° C., and from about 250° C. to about 300° C. in some embodiments.

The reaction pressure may be from about 0.1 Torr to about 760 Torr. In some embodiments, the reaction pressure may be from about 0.5 Torr to about atmospheric pressure.

With continued reference to FIG. 2, at block 120, as discussed above, a semiconductor oxide-containing layer is formed. The oxide-containing layer is preferably formed by ALD, by exposing the substrate to temporally separated pulses of a semiconductor precursor and an oxygen precursor. In some embodiments, the semiconductor precursor deposits the same semiconductor as present in the underlying substrate. For example, a germanium precursor may be used to deposit a germanium oxide over an exposed germanium-containing substrate surface.

In some embodiments, the semiconductor precursor may be a semiconductor-organic or a semiconductor halide compound. For example, the semiconductor precursor may be a semiconductor alkoxide or alkylamine. Where the semiconductor is germanium, suitable germanium precursors include a germanium alkoxide (e.g., germanium ethoxide), a germanium alkylamine, germanium chloride, and cyclic germylene.

Upon contacting the substrate, the semiconductor precursor preferably absorbs on the substrate. In some embodiments, the substrate is subsequently exposed to an oxygen precursor, which reacts with the semiconductor precursor to form an oxide of the semiconductor, e.g., germanium oxide. Examples of oxygen precursors include $O_2$, $O_3$, $H_2O$, $H_2O_2$, $N_2O$, NO, $NO_2$, and combinations thereof. In some embodiments, the oxygen precursor is not part of a plasma and forms a thermal oxide with the semiconductor. In some embodiments, the oxygen precursor comprises oxygen radicals, for example oxygen radicals made by plasma. It will be appreciated that sequential and alternating exposure to the semiconductor precursor and an oxygen precursor constitute a deposition cycle, which may be repeated until an oxide layer of a desired thickness is deposited.

With continued reference to FIG. 2, at block 130, the oxide layer is nitrided, by exposing the oxide containing layer to a nitrogen-containing precursor. Preferably, the nitridation is performed as discussed above regarding block 115 of FIG. 1. Preferably, the nitriding is performed thermally, without exposing the nitrogen containing precursor to a plasma or excited species generated from a plasma.

With continued reference to FIG. 2, in some embodiments, blocks 120 and 130 may be performed during an atomic layer deposition that cycles through multiple performances of blocks 120 or 130. In some embodiments, block 130 is performed intermittently during the deposition of the semiconductor oxide layer, and blocks 120 and 130 may be sequentially repeated multiple times. For example, block 130 may alternate with one or more ALD deposition cycles for depositing the semiconductor oxide at block 120, thereby forming a semiconductor oxynitride compound. As a result, the block 115 may be considered to be a semiconductor oxynitride deposition cycle in some embodiments, and block 115 may be repeated until a desired semiconductor oxynitride layer thickness is formed. In some embodiments, each semiconductor oxynitride deposition cycle includes a nitridation step. In some other embodiments, ALD deposition sub-cycles in block 120 for the semiconductor oxide (e.g., GeO deposition cycles) may be alternated with nitridation sub-cycles in bloc 130 that include exposures to a semiconductor precursor and the nitrogen precursor. For example, one or more ALD deposition sub-cycles in block 120 for the semiconductor oxide may be alternated with one or more sub-cycles in block 130 that include exposure to a semiconductor precursor and a subsequent exposure to the nitrogen precursor.

It will be appreciated that for any of the atomic layer depositions herein, the relative ratios of pulses of precursors may deviate from a 1:1 ratio. For example, each deposition cycle or sub-cycle may include one or more pulses of the same precursor. For example, an oxide deposition may include a plurality of semiconductor precursor exposures per one oxygen precursor exposure, or a plurality of oxygen precursor exposures per semiconductor precursor exposure. Similarly, a nitridation may include a plurality of nitrogen precursor exposures per one semiconductor precursor exposure, or a plurality of semiconductor precursor exposures per nitrogen precursor exposure. For example, if increasing the amount of semiconductor or nitrogen in a film is desired, at least one ALD cycle, every other ALD cycle, or every third, fourth, fifth, sixth cycle, etc. could include one or more additional semiconductor or nitrogen precursor pulses, respectively. Similarly, if increasing the amount of oxygen or semiconductor in the semiconductor oxynitride film is desired, at least one ALD cycle, every other ALD cycle, or every third, fourth, fifth, sixth cycle, etc. could include one or more additional oxygen or semiconductor precursor pulses, respectively.

In some embodiments, as discussed herein, the semiconductor oxynitride deposition cycle may include a semiconductor oxide deposition sub-cycle and a semiconductor nitride deposition sub-cycle. For example, the semiconductor oxide deposition sub-cycle may include exposure to a semiconductor precursor and an oxygen precursor (ratios of which may vary, as discussed above), and the semiconductor nitride sub-cycle may include exposure to a semiconductor precursor and a nitrogen precursor (ratios of which may vary, as discussed above). In some embodiments, the ratios of the semiconductor oxide deposition sub-cycle to the semiconductor nitride deposition sub-cycle may vary, for example from about 2:1 to about 1:5.

In addition, the relative ratios of the precursors may vary over the course of the interlayer deposition to form an interlayer with a graded composition. For example, the ratio of semiconductor precursor to oxygen precursor or nitrogen precursor to semiconductor precursor may change with time. In some embodiments, the ratio of the semiconductor oxide deposition sub-cycle 120 to the semiconductor nitride deposition sub-cycle 130 may change with time, e.g., increase with time to form an oxynitride layer with an increasingly higher oxygen concentration with increasing thickness. In some other embodiments, the degree of nitridation may be varied, e.g., by varying the number and/or duration of the pulses of the nitrogen precursor over the course of the deposition of the semiconductor oxynitride layer to form an oxynitride layer with e.g. an increasingly higher nitrogen concentration with increasing thickness.

After the semiconductor surface is passivated, various additional layers of material may be formed on the passivated surface. For example, a dielectric layer, e.g., a high-k dielectric such as $HfO_2$, may be deposited over the interlayer and a conductive gate material may be deposited over the dielectric layer to form a gate stack. In some embodiments, the conductive gate material may be a metal. It will be appreciated that other layers of material may also be provided between the semiconductor oxynitride layer and the dielectric layer, or between the dielectric layer and the conductive gate material, to provide desired physical and/or electrical properties in some embodiments.

Figure 6:
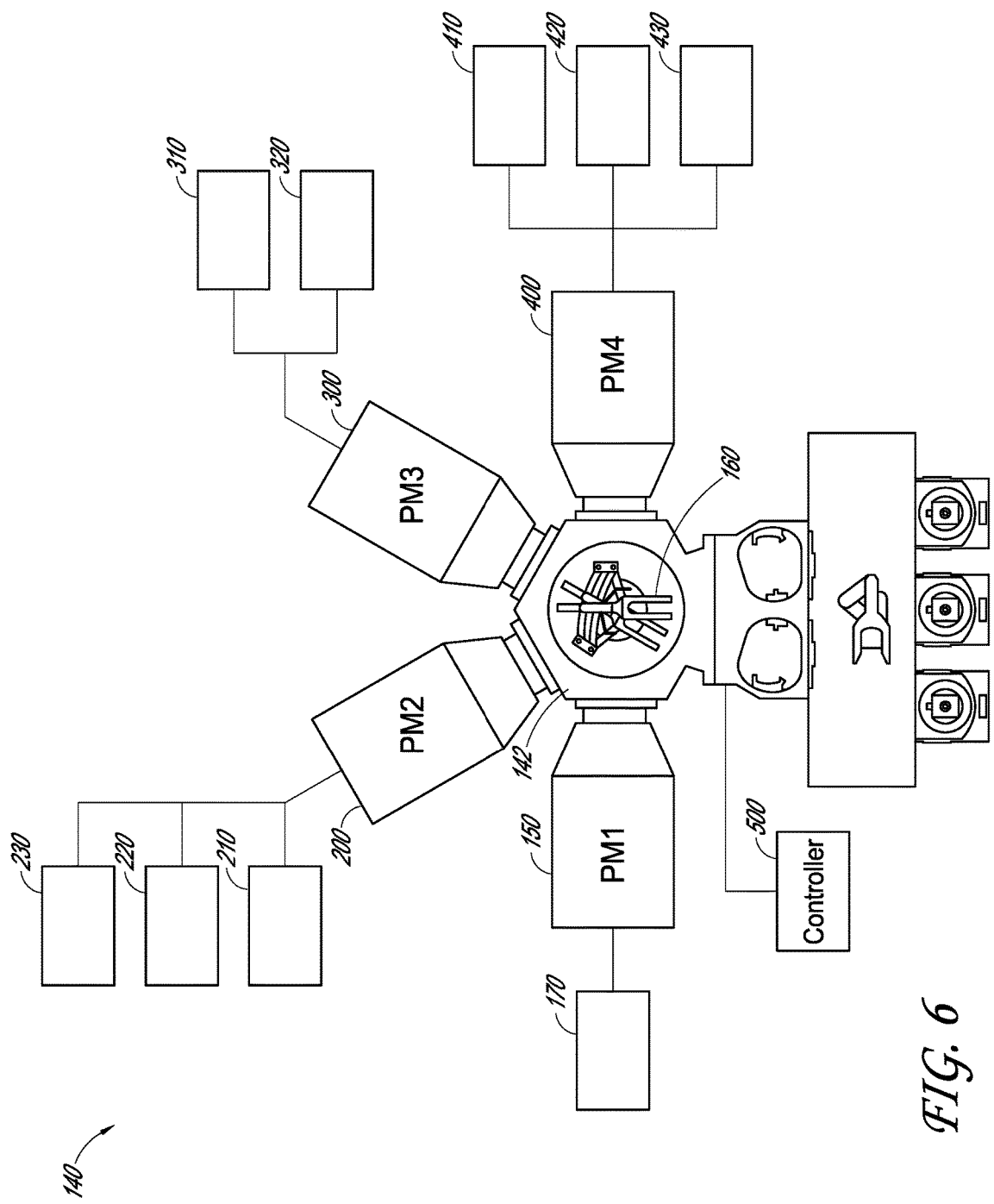
FIG. 6 shows an example of a semiconductor reactor system, according to some embodiments.

With reference to FIG. 6, a semiconductor reactor system 140 is illustrated. The reactor system 140 may include a transfer chamber 142 around which a plurality of reaction chambers 150, 200, 300, and 400 (or process modules, PM) are arrayed. Each of the reaction chambers 150, 200, 300, and 400 have a closable opening through which a substrate may be transported in and out for loading and unloading, respectively, of the substrate into the reaction chamber. One or more robots 160 may be provided in a transfer chamber 142 for loading and unloading the substrate and transferring the substrate between the chambers 150, 200, 300, and 400. In some embodiments, the chambers 150, 200, 300, and 400 may be single substrate chambers configured to accommodate and process one substrate at a time.

It will be appreciated that each of the chambers 150, 200, 300, and 400 may be configured to conduct different treatments and/or depositions on a substrate accommodated in the chamber. For example, each of the chambers 150, 200, 300, and 400 may be connected to reactant and/or precursor sources that contain reactants and/or precursors used for the various treatments and/or depositions. For example, the first reaction chamber 150 may be connected to a reactant source 170. In some embodiments, the first reaction chamber may be a pre-treatment or pre-clean chamber, and the reactant source 160 may include a pre-treatment reactant, such as $(NH_4)_2S$, $H_2S$, HCl, HBr, $Cl_2$, HF, or combinations thereof.

With continued reference to FIG. 6, the second reaction chamber 200 may be connected to a precursor source 210. In some embodiments, the second reaction chamber 200 may be a nitridation chamber configured for nitridation of the substrate, and the precursor source 210 may include a nitrogen precursor, such as hydrazine, a hydrazine derivative, or a combination thereof. In some embodiments, the second reaction chamber 200 may also be configured to form an oxide layer on the substrate. In such embodiments, the second reaction chamber 200 may also be connected to an oxygen precursor source 220 and optionally a semiconductor precursor source 230. The oxygen precursor source 220 may be utilized to oxidize the substrate, as discussed herein. In some embodiments, the substrate may be separately exposed to the semiconductor, oxygen, and nitrogen precursors to form an oxynitride layer.

It will be appreciated that, in some embodiments, the pre-treatment and the nitridation may be performed in the same chamber. For example, the first reaction chamber 150 may be configured to perform both the pre-treatment and the nitridation, and/or the second reaction chamber 200 may be configured to perform both the pre-treatment and the nitridation. In such arrangements, one or both of the first reaction chamber 150 and the second reaction chamber 200 may be connected to both the reactant source 170 and the precursor source 210. Preferably, in such arrangements, the process temperatures for both the pre-treatment and the nitridation are the same.

With continued reference to FIG. 6, the third reaction chamber 300 may be connected to precursor sources 310 and 320. In some embodiments, the third reaction chamber 200 may be a dielectric deposition chamber configured to deposit a layer of dielectric material on the substrate, and the precursor sources 310 and 320 may include first and second mutually reactive precursors, respectively. In some embodiments, the precursor source 310 includes a hafnium precursor and the precursor source 320 includes an oxygen precursor.

The fourth reaction chamber 400 may be connected to precursor sources 410, 420, and 430. In some embodiments, the fourth reaction chamber 400 may be another dielectric deposition chamber configured to deposit another layer of dielectric material on the substrate, and the precursor sources 410, 420, and 430 may include third, fourth, and fifth mutually reactive precursors, respectively. In some embodiments, the precursor source 410 may include a rare earth metal (e.g., lanthanum) precursor, the precursor source 420 may include a silicon precursor, and the precursor source 430 may include an oxygen precursor. Examples of suitable rare earth metal precursors, silicon precursors, and oxygen precursors are discussed above regarding FIG. 1.

It will be appreciated that the number of precursor sources attached to the reaction chambers 150, 200, 300, and 400, and the chemical species in those precursor sources, may be varied depending upon the treatments and/or depositions to be carried out in those chambers. For example, for a given deposition in a given reaction chamber, an appropriate set of precursors for that deposition may be provided. In addition, while not illustrated, it will be appreciated that sources of inert gas may also be in gas communication with one or more of the reaction chambers 150, 200, 300, and 400 to provide, e.g., carrier and/or purge gases to those reaction chambers.

With continued reference to FIG. 6, the reactor system 140 may be controlled by a controller 500, which may include one or more hardware processors and one or more physical memories containing programming. The controller 500 may be in data communication with the reaction chambers 150, 200, 300, and 400, for example via wired and/or wireless communication. The controller 500 contains a program to instruct the reactor system 140 to implement the steps of any of the processes described herein. The timing and sequence of precursors or reactants, among other process parameters can be programmed into the controller 500. In some embodiments, one or more programs to implement the process of FIGS. 1 and/or 2 may be programmed into the controller 500.

EXAMPLE 1

Hydrazine passivation of germanium was investigated in a metal oxide semiconductor (MOS) capacitor, which has a structure similar to a MOS transistor, except that PN junctions (and source/drain regions) are absent. The germanium was part of a 1.5 μm germanium layer grown epitaxially on a silicon wafer and p-doped. The substrate was then pre-treated by being dipped in HF. The pre-treated p-doped germanium-containing substrate surface was then passivated by exposure to hydrazine in a Pulsar® ALD reactor available from ASM International N.V. of Almere, the Netherlands. The exposure duration was 1 minute, at a process temperature of 250° C. A 2 nm aluminum oxide layer and then a 2 nm hafnium oxide layer were deposited to form a dielectric stack over and contacting the hydrazine-treated surface. Platinum was deposited on the dielectric stack as a gate electrode, thereby forming the MOS capacitor. The platinum was deposited by evaporation, which included depositing platinum dots on one side of the substrate and a blanket platinum layer on the back side. The resulting structure provided a $V_{FB}$ (flat band voltage) of roughly 0.7V, indicating an effective work function for the platinum of about 5.27 eV and low fixed charges.

Figure 3:
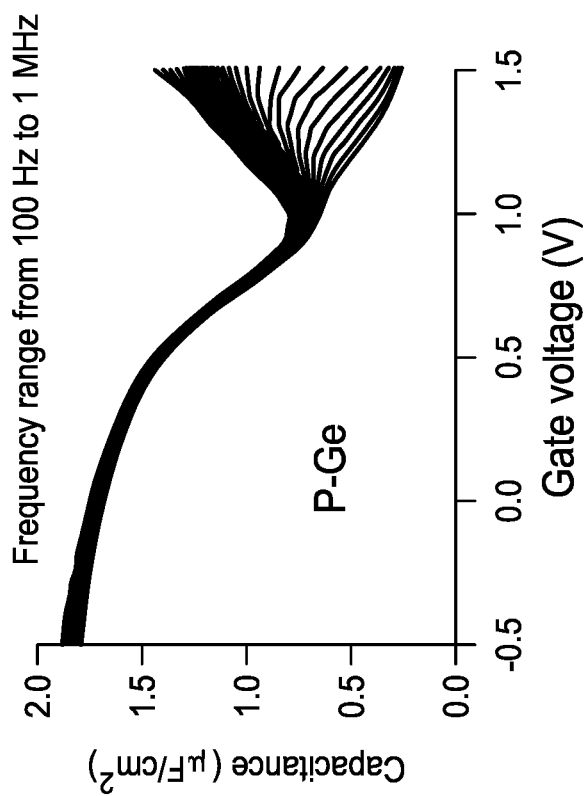
FIG. 3 shows a plot of capacitance vs. voltage with a frequency range from 100 Hz to 1 MHz for a metal oxide semiconductor capacitor having a hydrazine treated germanium surface, according to some embodiments.

FIG. 3 shows a plot of capacitance vs. voltage with a frequency range from 100 Hz to 1 MHz for the metal oxide semiconductor capacitor having the hydrazine treated germanium surface. It will be appreciated that CET is the capacitance effective thickness, which is equal to the effective oxide thickness (EOT) plus a quantum mechanical correction and Dit is the interface state density. As show, the hydrazine treatment resulted in advantageously low Dit, CV dispersion, and CV hysteresis values.

Figure 4A:
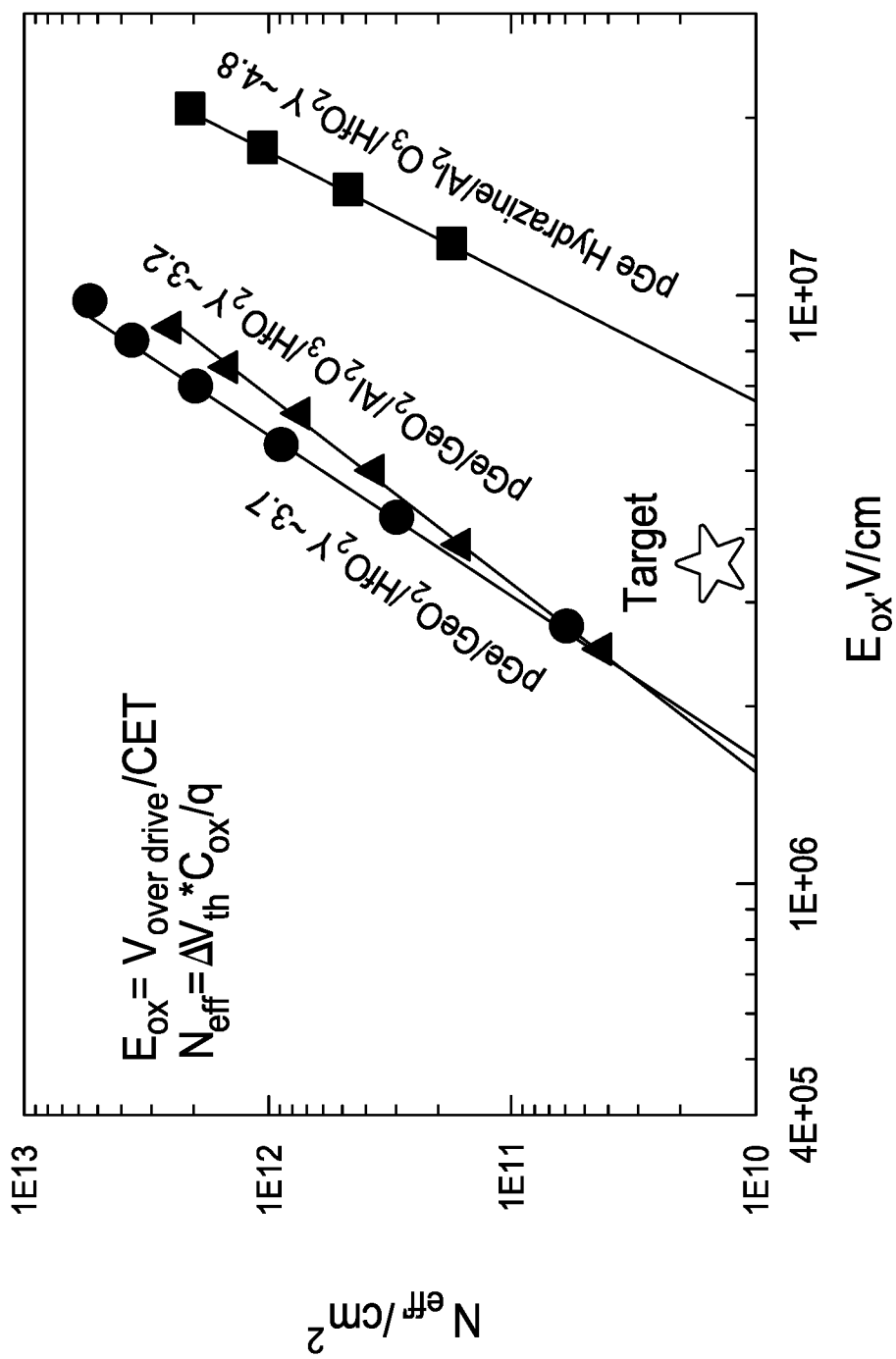
FIGS. 4A and 4B show plots illustrating voltage accelerator gamma and $N_{eff}$, according to some embodiments.

FIG. 4A shows plots illustrating voltage accelerator gamma and $N_{eff}$ (equivalent sheet charge) for the MOS capacitor, formed by a p-doped germanium substrate having a hydrazine treated surface with an overlying dielectric stack of a 2 nm hafnium oxide layer overlying a 2 nm aluminum oxide layer. Included for comparison are values for, from left to right, i) a p-doped germanium substrate having a germanium oxide formed between the substrate and a hafnium oxide layer, and ii) a p-doped germanium substrate having a germanium oxide formed between the substrate and a dielectric stack of a 2 nm hafnium oxide layer overlying a 2 nm aluminum oxide layer. It will be appreciated that the $N_{eff}$ is advantageously low, while the voltage accelerator gamma (γ) (the respective slope of the illustrate lines) is advantageously high for the hydrazine treated germanium substrate. The target was set at 5e10/cm²@3.5 MV/cm, which presented a reliability specification for a device able to sustain 0.5V overdrive at 1.4 nm CET. Notably, the hydrazine treated germanium substrate exceeded the target.

EXAMPLE 2

Passivation of p-doped and n-doped germanium using a germanium oxynitride layer was investigated in a MOS capacitor. As in Example 1, the germanium was part of a 1.5 µm germanium layer grown epitaxially on a silicon wafer and p-doped and n-doped. The substrate was then pre-treated by being dipped in HF. A germanium oxynitride layer was deposited on each of a p-doped and n-doped germanium substrate. The deposition was performed a Pulsar® ALD reactor available from ASM International N.V. of Almere, the Netherlands. The germanium oxynitride interlayer as deposited by ALD using tetrakis(dimethylamino)germanium (TDMAGe) as the germanium precursor, $H_2O$ as the oxygen precursor, and hydrazine ($N_2H_4$) as the nitrogen precursor. Each deposition cycle included the following sequence of pulses:
  TDMAGe
  $H_2O$
  TDMAGe
  $N_2H_4$
Ten cycles were performed, with $N_2H_4$ exposure durations of a few second each time. The durations of the precursor pulses and intervening purges were, in order, as follows: TDMAGe —3 s; Purge—4 s; H2O—3 s; Purge—6 s; TDMAGe—3 s; Purge—4 s; N2H4—3 s; Purge—6 s. The deposition cycles were repeated until a layer 1 nm thick was deposited. A 3 nm hafnium oxide layer was next deposited on the germanium oxynitride layer. A platinum gate electrode was then formed on the hafnium oxide layer.

Figure 4B:
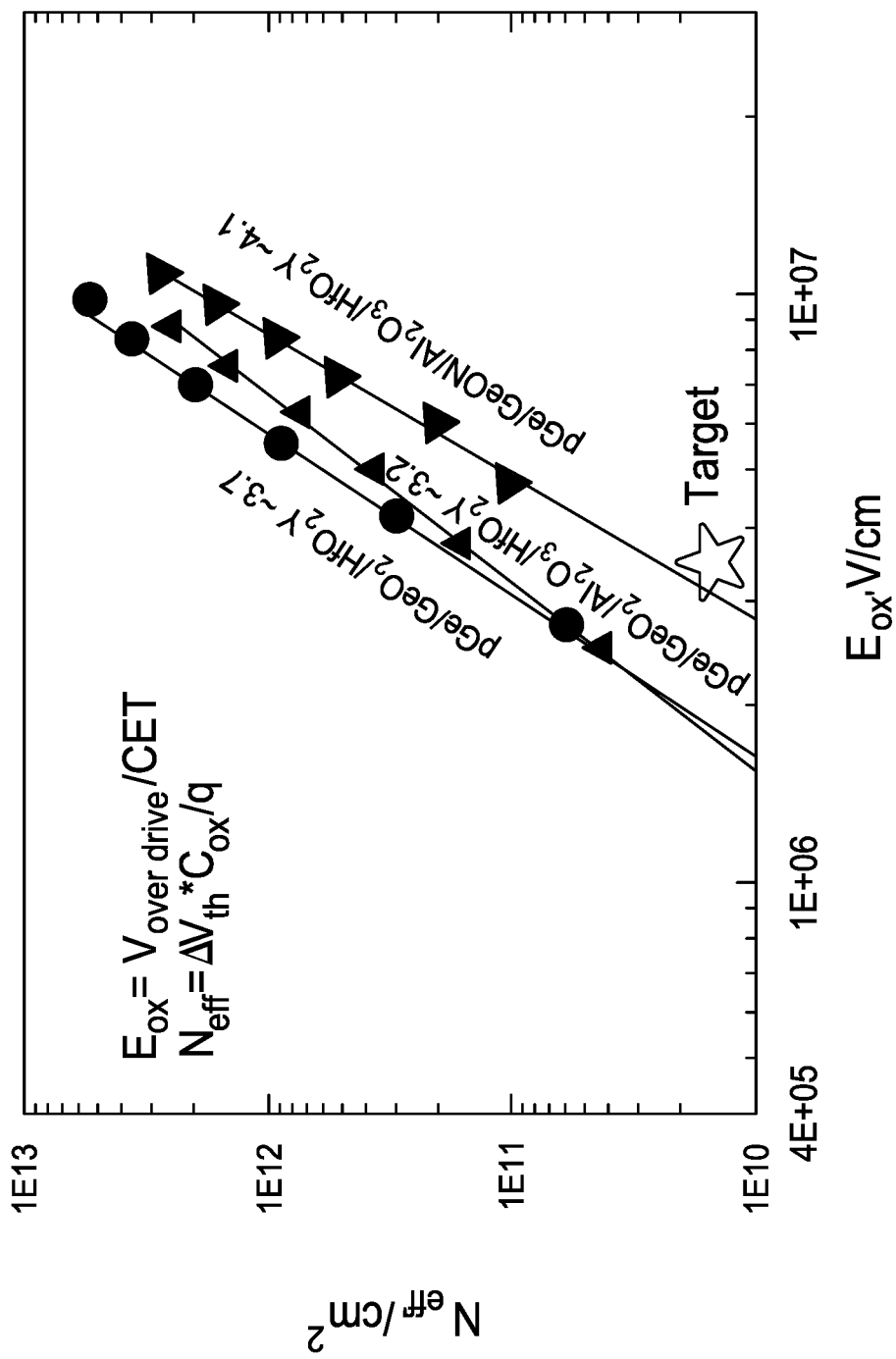

FIG. 4B shows a plot illustrating voltage accelerator gamma and $N_{eff}$ (equivalent sheet charge) for a MOS capacitor formed by a p-doped germanium substrate having a 1 nm ALD germanium oxynitride layer formed between the substrate and a dielectric stack of a 3 nm hafnium oxide layer overlaying a 1 nm aluminum oxide layer. As with Example 1, included for comparison are i) a p-doped germanium substrate having a germanium oxide formed between the substrate and a hafnium oxide layer, and ii) a p-doped germanium substrate having a germanium oxide formed between the substrate and a dielectric stack of a 2 nm hafnium oxide layer overlying a 2 nm aluminum oxide layer. Notably, $N_{eff}$ and gamma (γ) are both improved over comparison MOS capacitors i) and ii). Although the performance in terms of $N_{eff}$ and gamma (γ) is lower than for the nitrided pGe surface discussed in Example 1, this performance still meets the target and advantageously has a lower $D_{it}$ value than the sample that had the hydrazine treated p-doped germanium surface. Therefore, the germanium oxynitride provides an advantageous mix of performance parameters. It is expected that adjustments to the process of passivation using hydrazine or a hydrazine derivative could provide further increases in performance.

Figure 5:
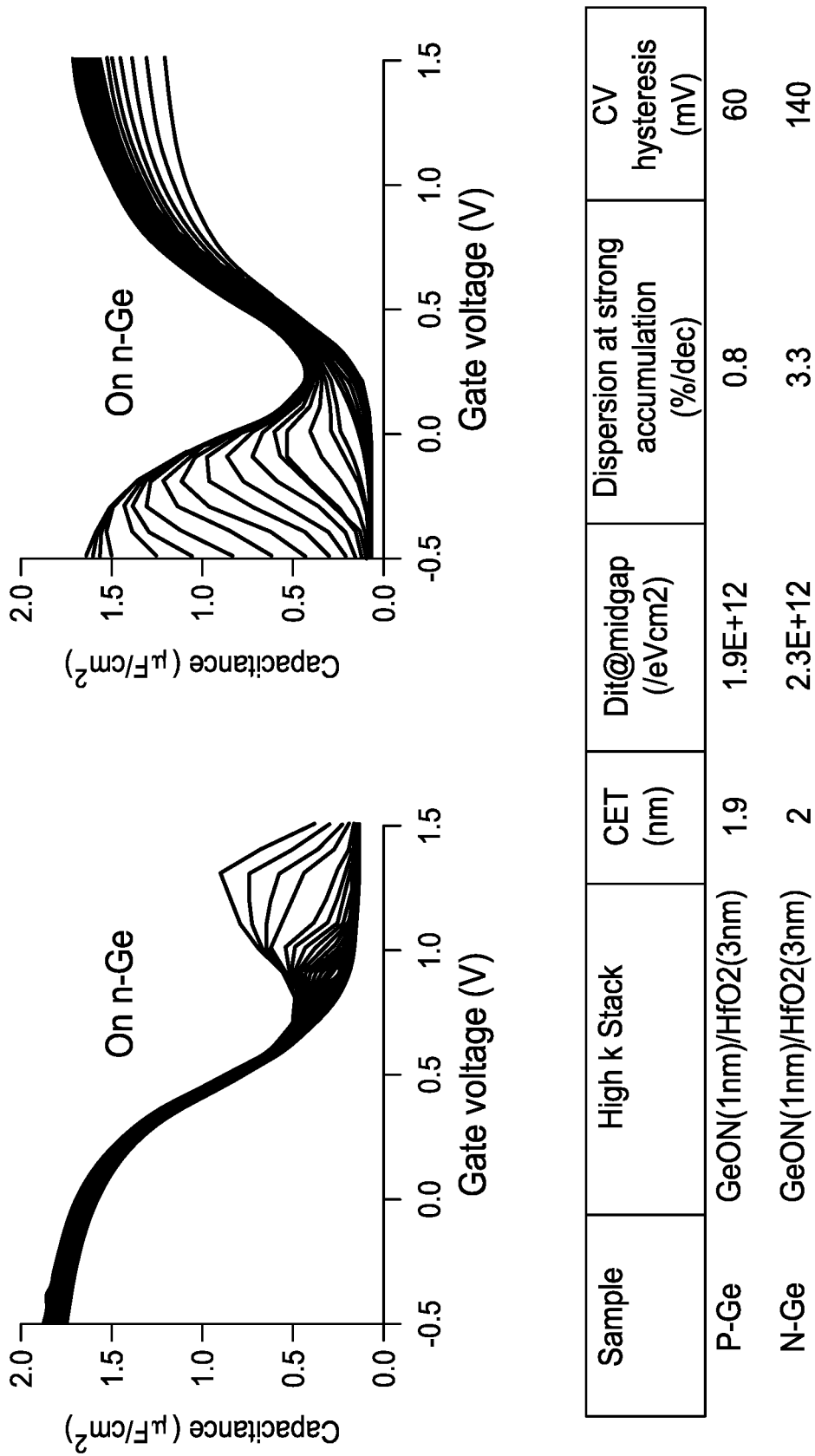
FIG. 5 shows plots of capacitance vs. voltage with a frequency dispersion range from 100 Hz to 1 MHz for hydrazine treated interlayers on p and n-doped germanium substrates, according to some embodiments.

FIG. 5 shows a plot of capacitance vs. voltage with a frequency range from 100 Hz to 1 MHz for the metal oxide semiconductor capacitor using the ALD oxynitride passivation layers described above. Advantageously, compared to an otherwise similar MOS capacitor having a germanium oxide (GeO) interlayer without nitrogen, the germanium oxynitride (GeON) improved $N_{eff}$ by a factor of 3.5 on the p-doped germanium substrate and a factor of 2.5 on the n-doped germanium substrate. A lower $N_{eff}$ is indicative of better stability and reliability. Thus, the GeON layer provided better stability than $GeO_2$. Notably, the GeON layer provided a clear reliability improvement on n-doped germanium substrates compared to a $GeO_2$ baseline reference (~2.5 times lower $N_{eff}$). It will be appreciated that such improvements on n-doped germanium substrates are particularly challenging to achieve.

EXAMPLE 3

Hydrazine passivation of silicon germanium containing 50% germanium was investigated in a metal oxide semiconductor (MOS) capacitor, which has a structure similar to a MOS transistor, except that PN junctions (and source/drain regions) are absent. The silicon germanium was part of a 20 nm silicon germanium layer formed on a silicon wafer. The substrate was pre-treated (pre-cleaned) by exposure to HCl for 5 minutes at 350° C. The pre-treated silicon germanium surface was then passivated by exposure to hydrazine in a Horizon® reactor available from ASM International N.V. of Almere, the Netherlands. The exposure duration was 1 minute, at a process temperature of 300° C. A 1 nm aluminum oxide layer and then a 3 nm hafnium oxide layer were deposited to form a dielectric stack over and contacting the hydrazine-treated surface. The deposition was performed in a Pulsar® reactor available from ASM International N.V. Platinum was deposited on the dielectric stack as a gate electrode, thereby forming the MOS capacitor. The platinum was deposited by evaporation, which included depositing platinum dots on one side of the substrate and a blanket platinum layer on the back side. The resulting structure advantageously provided a Dit of 5e11/eVcm².

EXAMPLE 4

Hydrazine passivation of silicon germanium containing 25% germanium was investigated in a metal oxide semiconductor (MOS) capacitor. All the details of this Example are the same as that of Example 3, except for the composition of the silicon germanium (25% in this Example, compared to 50% germanium in Example 3), and except for the hydrazine pre-treatment process temperature (400° C. in this Example, compared to 300° C. in Example 3). The resulting structure advantageously provided a Dit of 1.5e11/eVcm².

EXAMPLE 5

Hydrazine passivation of silicon was investigated in a metal oxide semiconductor (MOS) capacitor. All the details of this Example are the same as that of Example 4 except for the composition of the material to be passivated (silicon in this Example, compared to silicon germanium in Example 4). The resulting structure advantageously provided a Dit of 3.9e10/eVcm$^2$ for p-doped silicon, and 9.2e10/eVcm$^2$ for n-doped silicon.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for integrated circuit fabrication comprising:
   removing native oxide from a surface of a semiconductor substrate to form a pre-clean substrate surface;
   subsequently passivating the surface by exposing the pre-cleaned substrate surface to at least one of hydrazine and a hydrazine derivative to nitride the pre-cleaned surface to convert the pre-cleaned surface into a nitride passivation layer before depositing material from an other chemical species on the pre-cleaned surface;
   depositing an interface layer on the nitride passivation layer, wherein the interface layer comprises a metal oxide comprising silicon; and
   depositing a high-κ gate dielectric layer on the interface layer.

2. The method of claim 1, wherein passivating the surface comprises passivating a transistor channel region.

3. The method of claim 1, wherein the high-κ gate dielectric layer comprises hafnium oxide.

4. The method of claim 1, wherein the metal oxide is lanthanum silicon oxide.

5. The method of claim 1, wherein removing native oxide comprises exposing the surface to HCl.

6. The method of claim 1, wherein removing native oxide comprises exposing the surface to a liquid phase etchant followed by exposing the substrate to a gas phase etchant.

7. The method of claim 1, wherein the surface of the semiconductor substrate comprises a high-mobility semiconductor.

8. The method of claim 7, wherein the high-mobility semiconductor comprises germanium.

9. The method of claim 8, wherein the high-mobility semiconductor comprises silicon germanium.

10. The method of claim 9, wherein the silicon germanium comprises less than 50% germanium.

11. The method of claim 1, wherein the surface of the semiconductor substrate is a silicon surface.

12. A method for integrated circuit fabrication comprising:
    removing native oxide from a surface of a transistor channel region of a semiconductor substrate to form a pre-clean substrate surface; and
    nitriding the surface by exposing the pre-clean substrate surface to a nitrogen precursor to convert the pre-cleaned surface into a passivation layer before depositing material from an other chemical species on the surface;
    depositing an interface layer directly on the passivation layer, wherein the interface layer comprises a metal oxide comprising silicon; and
    depositing a gate dielectric layer directly on the interface layer, wherein the gate dielectric layer is thicker than the interface layer.

13. The method of claim 12, wherein the nitrogen precursor is selected from the group consisting of hydrazine, hydrazine derivatives, and combinations thereof.

14. The method of claim 12, wherein the channel region comprises silicon.

15. The method of claim 14, wherein the channel region comprises silicon and germanium.

16. The method of claim 12, wherein depositing the interface layer comprises depositing a layer of lanthanum silicon oxide; and wherein depositing the dielectric layer comprises depositing a layer of hafnium oxide.

* * * * *